United States Patent
Yamaguchi

(10) Patent No.: US 9,570,346 B2
(45) Date of Patent: Feb. 14, 2017

(54) METHOD OF MANUFACTURING SEMICONDUCTOR DEVICE

(71) Applicant: FUJI ELECTRIC CO., LTD., Kawasaki-shi, Kanagawa (JP)

(72) Inventor: Kazuya Yamaguchi, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/150,785

(22) Filed: May 10, 2016

(65) Prior Publication Data

US 2016/0351446 A1 Dec. 1, 2016

(30) Foreign Application Priority Data

Jun. 1, 2015 (JP) ................. 2015-111773

(51) Int. Cl.
*H01L 29/78* (2006.01)
*H01L 21/768* (2006.01)
*H01L 29/40* (2006.01)
*H01L 23/532* (2006.01)

(52) U.S. Cl.
CPC ... *H01L 21/76883* (2013.01); *H01L 21/76804* (2013.01); *H01L 21/76829* (2013.01); *H01L 21/76846* (2013.01); *H01L 21/76856* (2013.01); *H01L 21/76864* (2013.01); *H01L 21/76871* (2013.01); *H01L 23/53252* (2013.01); *H01L 29/401* (2013.01)

(58) Field of Classification Search
CPC .................. H01L 21/28518; H01L 2924/0002; H01L 21/76846; H01L 21/28556; H01L 21/76856
See application file for complete search history.

(56) References Cited

U.S. PATENT DOCUMENTS

| | | | | |
|---|---|---|---|---|
| 5,545,592 A | * | 8/1996 | Iacoponi | H01L 21/28518 257/E21.165 |
| 6,218,297 B1 | * | 4/2001 | Marsh | H01L 21/76843 257/E21.009 |
| 2010/0140617 A1 | * | 6/2010 | Kuroda | H01L 21/84 257/48 |
| 2012/0112277 A1 | * | 5/2012 | Denison | H01L 21/82381 257/337 |

FOREIGN PATENT DOCUMENTS

| | | |
|---|---|---|
| JP | H6-314722 A | 11/1994 |
| JP | H10-112446 A | 4/1998 |
| JP | H11-145085 A | 5/1999 |
| WO | WO-2007/110988 A1 | 10/2007 |

* cited by examiner

*Primary Examiner* — Jaehwan Oh
(74) *Attorney, Agent, or Firm* — Rabin & Berdo, P.C.

(57) ABSTRACT

A barrier metal is formed from a surface of an interlayer insulating film 2 to a trench that is formed in a semiconductor portion exposed in a contact hole. After RTA treatment and a plasma nitriding process, a plug is embedded at an inner side of the barrier metal inside the trench and the contact hole. The RTA treatment is performed at a temperature range of about 500 degrees C. to 650 degrees C. The plasma nitriding process is performed at a temperature lower than that of the RTA treatment. The barrier metal is formed by a first metal film of titanium and a second metal film of titanium nitride sequentially stacked. The plug is formed from tungsten. A surface electrode formed of aluminum is formed from a surface of the second metal film on the interlayer insulating film to a surface of the plug.

15 Claims, 9 Drawing Sheets

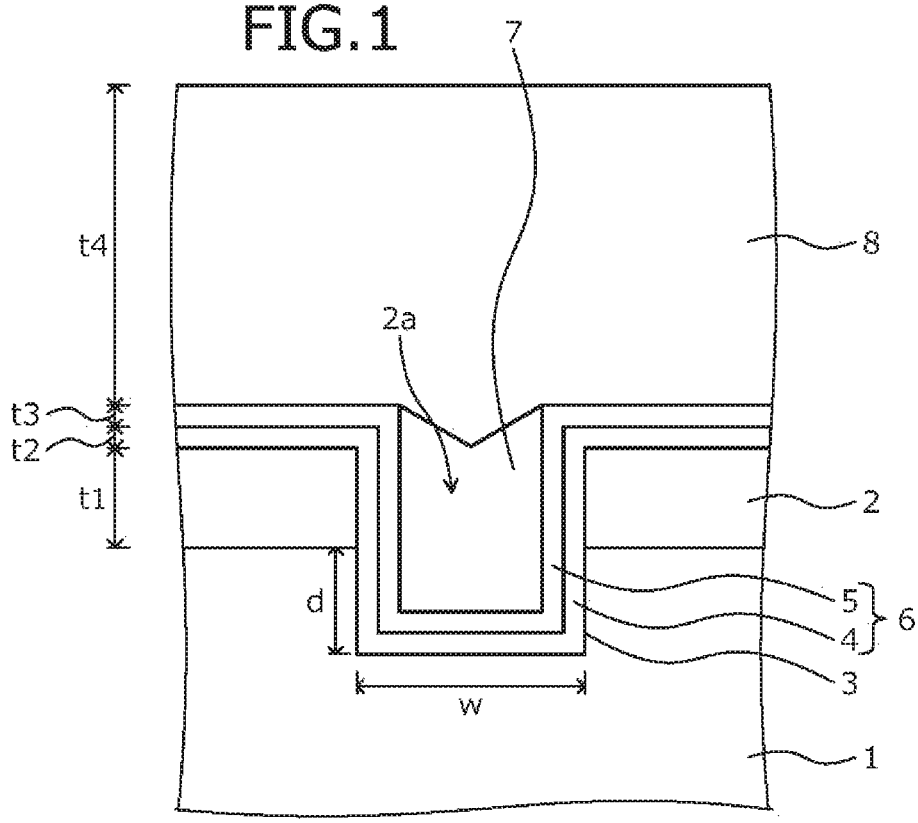

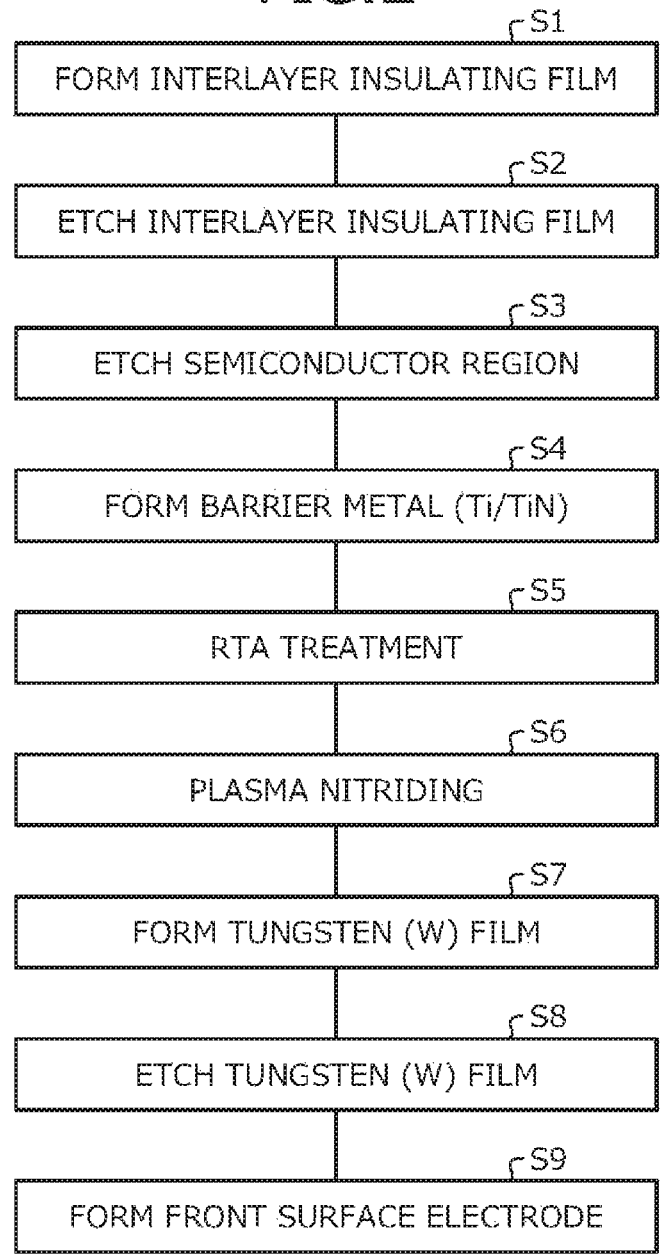

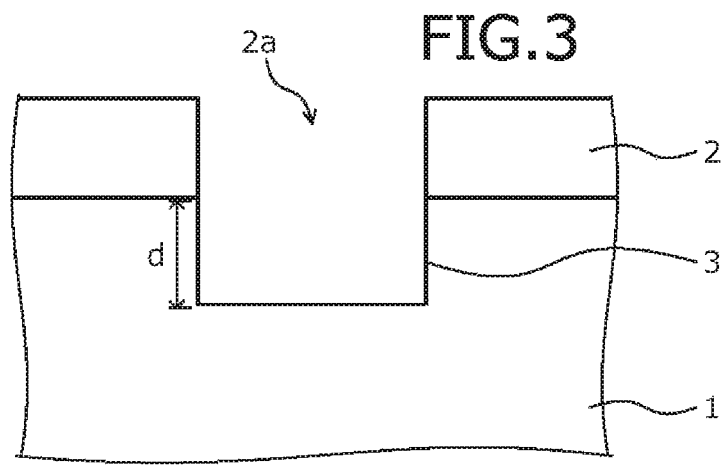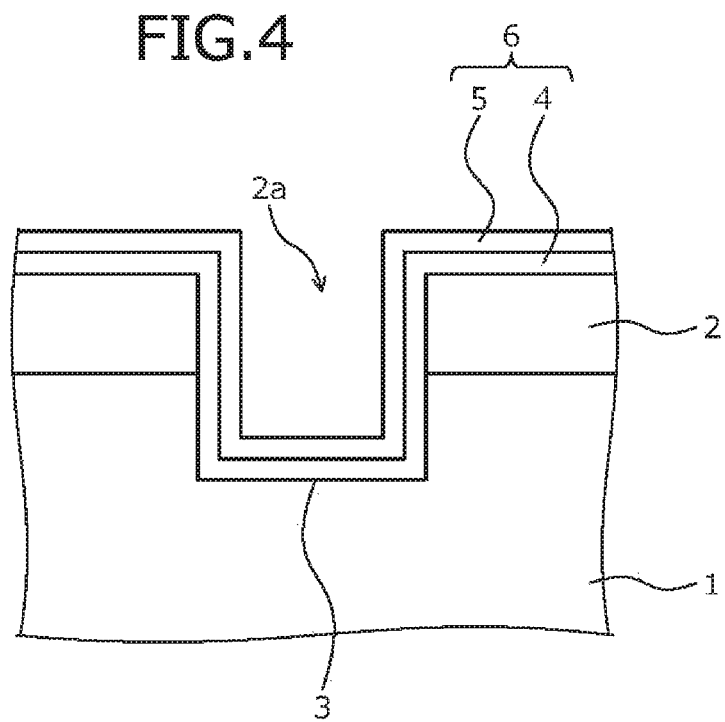

FIG.7

| TEMPERATURE OF RTA TREATMENT | 450°C | 500°C | 550°C | 600°C | 650°C | 700°C |
|---|---|---|---|---|---|---|
| CONTACT RESISTIVITY | HIGH | LOW | LOW | LOW | LOW | LOW |
| BARRIER METAL PEELING | NO | NO | NO | NO | NO | YES |

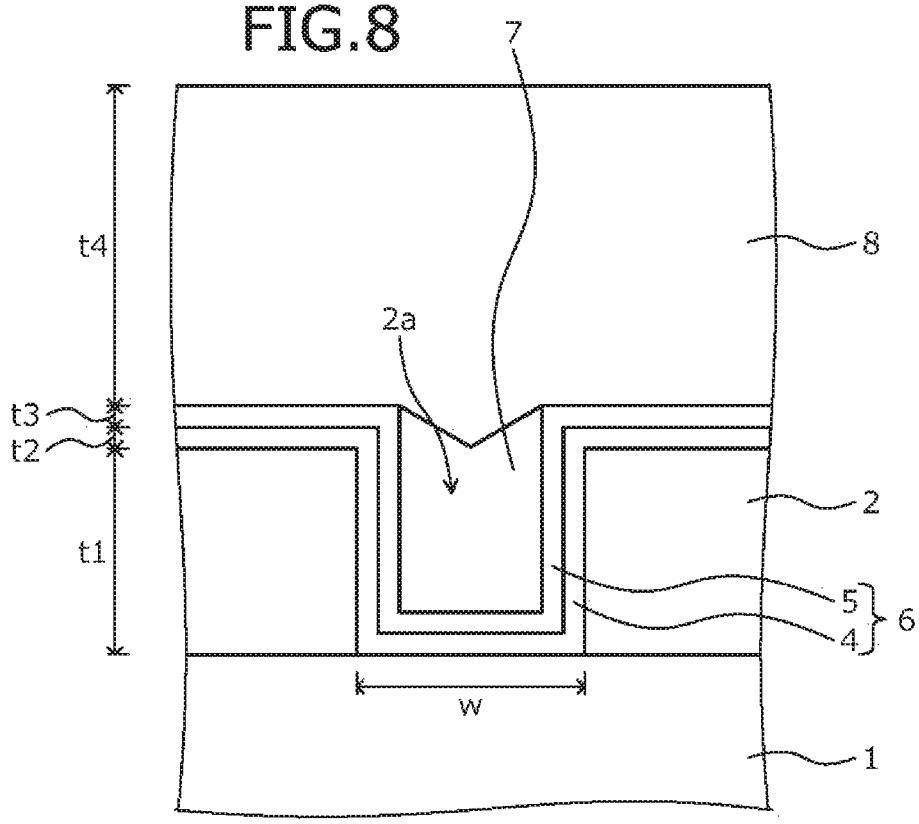

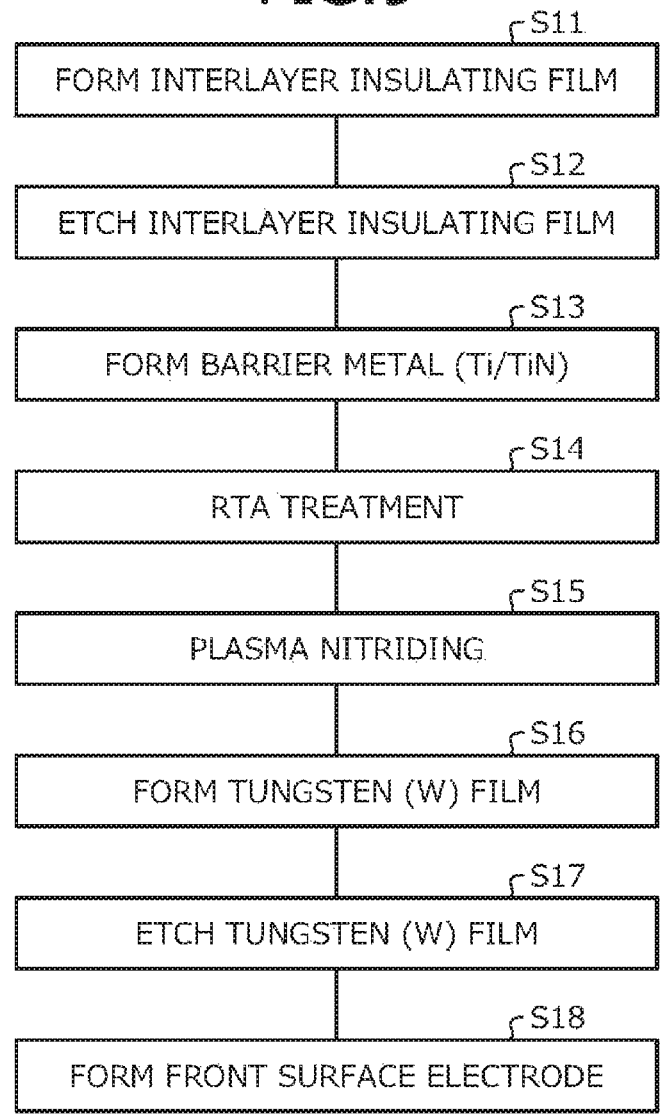

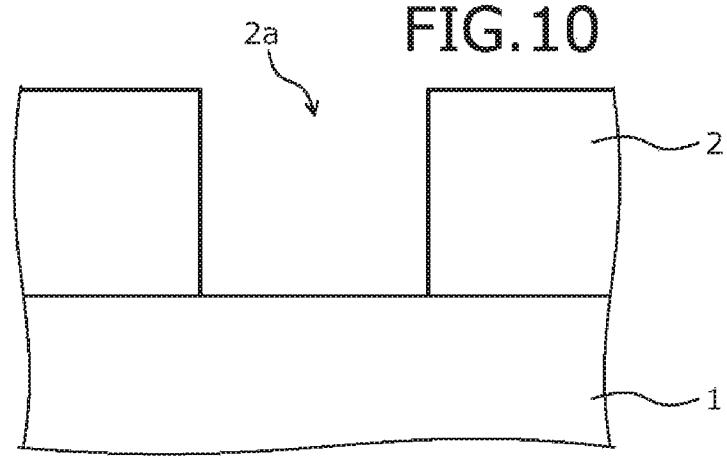
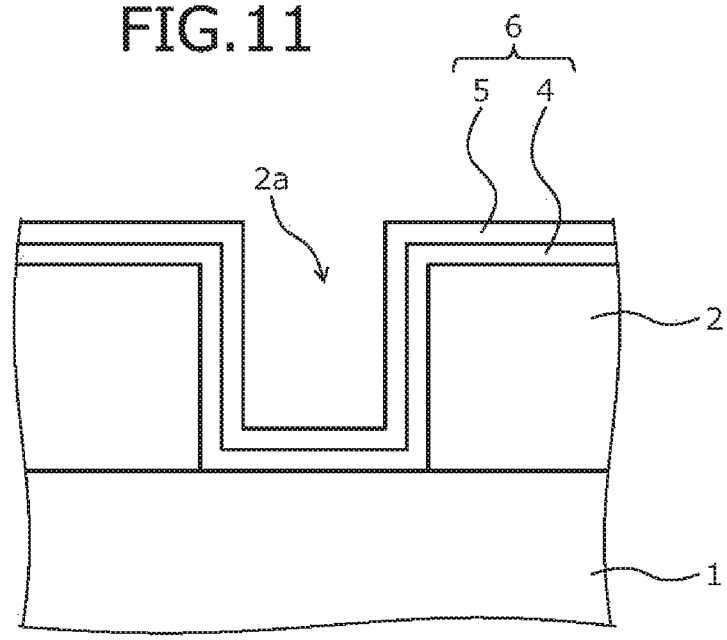

METHOD OF MANUFACTURING SEMICONDUCTOR DEVICE

CROSS REFERENCE TO RELATED APPLICATIONS

This application is based upon and claims the benefit of priority of the prior Japanese Patent Application No. 2015-111773, filed on Jun. 1, 2015, the entire contents of which are incorporated herein by reference.

BACKGROUND OF THE INVENTION

1. Field of the Invention

The embodiments discussed herein are related to a method of manufacturing a semiconductor device.

2. Description of the Related Art

A conventional trench contact that forms a contact (electrical contact portion) with an electrode in an inner wall of a trench is formed by embedding the electrode inside the trench, which is formed in a semiconductor substrate. As a trench contact, use of a contact between a metal electrode and a part of a semiconductor portion of a gate electrode or source region formed in a surface side of a semiconductor substrate enables increased contact area and low contact resistivity. Further, use of a contact between the semiconductor portion and metal electrode as a trench contact enables reductions in size without increasing contact resistivity.

In a conventional process for manufacturing a semiconductor device having a conventional trench contact, heat treatment by rapid thermal annealing (RTA) may be performed to a titanium (Ti) and titanium nitride (TiN) film formed on walls of the trench. Objectives of performing the RTA treatment are primarily the following two points. The first objective is to convert the titanium film to a silicide, form an ohmic contact with the semiconductor region, and lower contact resistivity. The second objective is to improve the function of the barrier metal by nitriding the titanium atoms (hereinafter, unreacted titanium atoms) that remain unreacted in the titanium nitride film when heat treatment is performed in a nitrogen ($N_2$) atmosphere and the titanium nitride film is formed. Therefore, when the RTA treatment is not sufficiently performed and the nitriding of unreacted titanium atoms does not progress, unreacted titanium atoms remain in the titanium nitride film. In the titanium nitride film, the portion in which unreacted titanium atoms remain reduces the function of the barrier metal and the following problem arises.

When the function of the titanium nitride film decreases as a barrier metal, fluorine (F) atoms included in a source gas ($WF_6$) used in the formation of the tungsten plug enter the titanium nitride film, pass through the titanium nitride film, and reach the lower layer, the titanium film. These fluorine atoms react with the titanium atoms inside the titanium film and at a side surface of the trench, a gap forms between the titanium film and the titanium nitride film whereby the function of the barrier metal further decreases consequent to the titanium nitride film peeling from the titanium film (hereinafter, peeling of the titanium nitride film). To avoid such problems, the RTA treatment is performed at a high temperature of around 700 degrees C. (a range of about 690 degrees C. to 750 degrees C.), the titanium film is converted into a silicide and the unreacted titanium atoms inside the titanium nitride film are nitrided and decrease.

On the other hand, performing the RTA treatment at a high temperature of about 700 degrees C. results in a decrease of the adhesion of the interlayer insulating film and the barrier metal, creating a new problem. The inventor has confirmed that if the adhesion of the interlayer insulating film and the barrier metal decreases, the barrier metal peels and curls away from the interlayer insulating film (hereinafter, peeling of the barrier metal) consequent to ultrasonic vibration, load, etc. applied to wires during wire bonding to join wires to the surface electrode. Barrier metal that has peeled from the interlayer insulating film during wire bonding collects near the joined portion of the wire and the surface electrode, and a portion where no barrier metal is present occurs between the interlayer insulating film and the surface electrode. Such peeling of barrier metal is dependent on the temperature of the RTA treatment and tends to occur more frequently the higher the temperature of the RTA treatment is.

To improve the adhesion of the interlayer insulating film and the barrier metal, a semiconductor device has been proposed in which a titanium-silicon (Ti—Si) film is formed on an interlayer insulating film that is formed in a silicon substrate surface, barrier metal that is formed sequentially by a titanium film and a titanium nitride film is further stacked on the Ti—Si film, and electrode wiring is disposed on the barrier metal (for example, refer to Japanese Patent Application Laid-Open Publication No. H6-314722). In Japanese Patent Application Laid-Open Publication No. H6-314722, formation of the Ti—Si film between the interlayer insulating film and the titanium film prevents the organization near the interface of the interlayer insulating film from becoming vulnerable during the high-temperature heat treatment for reducing contact resistivity of the barrier metal consequent to the metal element titanium configuring the barrier metal.

As a method of forming a contact, a method has been proposed in which a contact hole is formed in an interlayer insulating film, a titanium silicide film is formed by RTA treatment after a titanium film is formed on the interlayer insulating film by chemical vapor deposition (CVD), and thereafter, a titanium nitride film is formed by a plasma CVD method that uses a mixed gas that includes a halogenated titanium compound and nitriding agent (for example, refer to Japanese Patent Application Laid-Open Publication No. H10-112446 (paragraphs 0033 to 0035)). In Japanese Patent Application Laid-Open Publication No. H10-112446, when the titanium nitride film is formed by the plasma CVD method, the titanium film that remains unreacted and contacts the interlayer insulating film reacts with a reactive nitrogen species and is nitrided and thus, converted into a titanium nitride film.

As another method of forming a contact, a method has been proposed in which after a titanium film and a titanium nitride film are sequentially formed along an inner wall of a contact hole on an interlayer insulating film, an exposed portion of the titanium film is nitrided by RTA treatment at 650 degrees C. in a nitrogen atmosphere to form a titanium nitride film (for example, refer to Japanese Patent Application Laid-Open Publication No. H11-145085 (paragraphs 0007, 0009, and 0015)). In Japanese Patent Application Laid-Open Publication No. H11-145085, before the formation of a tungsten plug, an exposed portion of a titanium film is converted into a titanium nitride film, whereby peeling of the tungsten plug formed thereafter can be prevented. Further, in Japanese Patent Application Laid-Open Publication No. H11-145085, a method nitriding the exposed portion of the titanium film by a plasma nitriding process is further proposed.

As yet another method of forming a contact, a method has been proposed in which before a tungsten plug that is connected to a titanium nitride film exposed in a contact hole is embedded in the contact hole, a plasma nitriding process is performed with respect to an inner wall of the contact hole (for example, refer to International Publication No. 2007/110988 (paragraphs 0039 to 0045)). In International Publication No. 2007/110988, before the tungsten plug is embedded in the contact hole, the plasma nitriding process is performed at a substrate temperature of 350 degrees C. and an inner wall of the contact hole is nitrided, whereby moisture-barrier property of the inner wall of the contact hole is enhanced.

Nonetheless, in Japanese Patent Application Laid-Open Publication No. H6-314722, although adhesion of the interlayer insulating film and the barrier metal can be enhanced by the Ti—Si film, formation processes for the Ti—Si film and an etching process for patterning the Ti—Si film have to be added and as result, manufacturing processes become complicated. Further, in Japanese Patent Application Laid-Open Publication No. H10-112446, since RTA treatment is performed between the formation of the titanium film and the formation of the titanium nitride film without continuous formation of the titanium film and the titanium nitride film that become the barrier metal, processes are difficult. In Japanese Patent Application Laid-Open Publication No. H11-145085 and International Publication No. 2007/110988, contact resistivity may increase as a result of a silicide not forming between the titanium film and silicon since the heat treatment temperature is low.

SUMMARY OF THE INVENTION

According to one aspect of the present invention, a method of manufacturing a semiconductor device includes forming an insulating film in a surface of a semiconductor substrate; forming a contact hole that penetrates the insulating film in a direction of depth and reaches the semiconductor substrate; forming a first metal film from titanium, from a surface of the insulating film to a surface of a semiconductor portion of the semiconductor substrate, exposed in the contact hole; forming a second metal film from titanium nitride, in a surface of the first metal film; converting the first metal film into a silicide by heat treatment; converting titanium atoms that remain unreacted inside the first metal film and the second metal film into a nitride by a plasma nitriding process; embedding a plug formed from tungsten, at an inner side of the second metal film inside the contact hole, after the heat treatment and the plasma nitriding process; and forming a surface electrode that includes aluminum as a principal constituent, from a surface of the second metal film on the insulating film to a surface of the plug. In converting the first metal film into a silicide, the heat treatment is performed at a temperature at which the titanium atoms inside the first metal film and the second metal film do not react with oxygen atoms inside the insulating film.

In the method, in converting titanium atoms into a nitride, the plasma nitriding process is performed at a temperature that is lower than that of the heat treatment.

In the method, in converting the first metal film into a silicide, the heat treatment is performed at a temperature range of 500 degrees C. to 650 degrees C.

In the method, in converting the first metal film into a silicide, rapid thermal treatment is performed as the heat treatment.

In the method, the first metal film and the second metal film are formed consecutively.

In the method, the first metal film is formed by sputtering.

In the method, the second metal film is formed by sputtering.

The method further includes forming a trench in the semiconductor portion, after forming the contact hole and before forming the first metal film. The first metal film is formed from the surface of the insulating film to an inner wall of the trench. The plug is embedded at an inner side of the second metal film inside the trench and the contact hole.

In the method, the semiconductor substrate is a silicon substrate.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 1 is a cross-sectional view of an example of a semiconductor device manufactured by a method of manufacturing a semiconductor device according to a first embodiment;

FIG. 2 is a flowchart of an outline of the method of manufacturing a semiconductor device according to the first embodiment;

FIGS. 3, 4, 5, and 6 are cross-sectional views of states of a semiconductor device according to the first embodiment during manufacture;

FIG. 7 is a chart indicating a suitable temperature range in the RTA treatment;

FIG. 8 is a cross-sectional view of an example of a semiconductor device manufactured according to the method of manufacturing a semiconductor device according to a second embodiment;

FIG. 9 is a flowchart of an outline of the method of manufacturing a semiconductor device according to the second embodiment; and FIGS. 10, 11, 12, and 13 are cross-sectional views of states of a semiconductor device according to the second embodiment during manufacture.

DETAILED DESCRIPTION OF THE INVENTION

Figure 5:
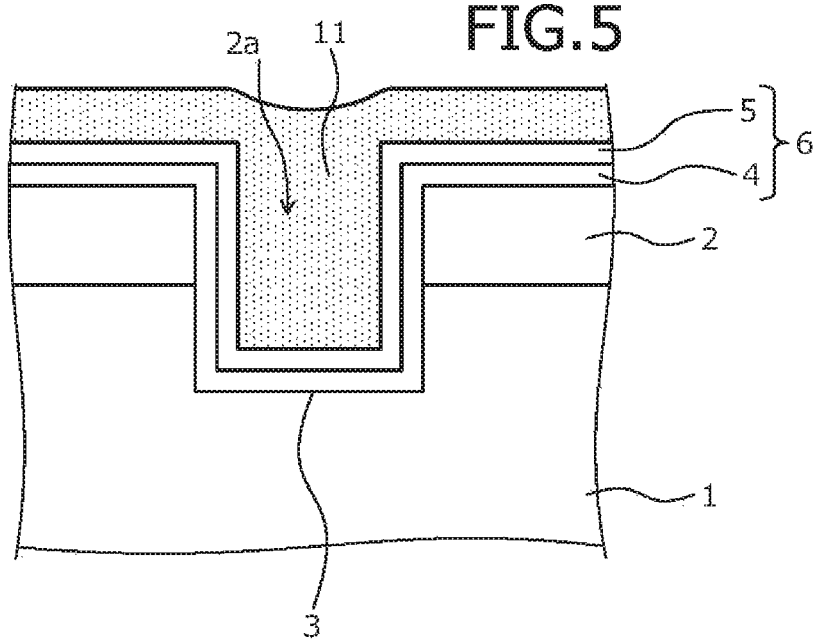

Preferred embodiments of a method of manufacturing a semiconductor device according to the present invention will be described in detail with reference to the accompanying drawings. In the description of the embodiments below and accompanying drawings, identical components are given the same reference numerals and redundant description is omitted.

First Embodiment

A case where a contact with a surface electrode that is formed on a substrate surface via an interlayer insulating film is a trench contact will be described as an example of a semiconductor device produced (manufactured) by the method of manufacturing a semiconductor device according to a first embodiment. FIG. 1 is a cross-sectional view of an example of a semiconductor device manufactured by the method of manufacturing a semiconductor device according to the first embodiment. The semiconductor device according to the first embodiment depicted in FIG. 1 includes a trench contact that is a contact with a surface electrode 8 at an inner wall of a trench 3 and formed by embedding, via a barrier metal 6, a plug (extracted portion of electrode) 7 in the trench 3 that is formed in a semiconductor substrate (semiconductor chip) 1. More specifically, for example, on a surface of the semiconductor substrate 1 such as a silicon (Si) substrate, an interlayer insulating film (insulating film) 2 of BPSG, etc. is disposed. The semiconductor substrate 1 may be an epitaxial substrate where a semiconductor layer has been epitaxially grown on an upper surface of a semiconductor substrate (starting substrate).

A contact hole 2a is disposed that penetrates the interlayer insulating film 2 in a direction of depth. In the contact hole 2a, for example, a predetermined semiconductor device region (not depicted), such as a base region, a source region, and a gate electrode, etc. of a MOSFET, disposed in the surface side of the semiconductor substrate 1 is exposed. In the portion of the semiconductor substrate 1 exposed by the contact hole 2a, the trench 3 of a predetermined depth d from the surface of the semiconductor substrate 1 is disposed. The barrier metal 6 is disposed so as to be from a surface of the interlayer insulating film 2 to an inner wall of the trench 3, and along the inner wall of the trench 3 and the contact hole 2a. In the barrier metal 6, a first metal film 4 formed from titanium (Ti) and a second metal film 5 formed from titanium nitride (TiN) are sequentially stacked.

The first metal film 4, for example, is converted into a silicide and forms an ohmic contact with a semiconductor (silicon) portion. The first metal film 4 is formed along the inner wall of the trench 3, whereby the ohmic contact of the first metal film 4 and the semiconductor device region becomes the trench contact. This trench contact, for example, in a case where the semiconductor device according to the first embodiment is a superjunction (SJ) MOSFET, is useful for both finer unit cells (device function unit) and enhanced avalanche tolerance. A superjunction is a structure in which a drift layer is a parallel pn layer where an n-type region of a high impurity concentration and a p-type region are alternately and repeatedly arranged in a parallel direction (lateral direction) in the substrate surface.

The first and second metal films 4, 5 have a function of preventing diffusion of metal atoms from an electrode (the plug 7 and the surface electrode 8) to the semiconductor substrate 1 and the interlayer insulating film 2 side and preventing mutual reaction between opposing regions between the first and second metal films 4, 5 or the second metal film 5. Inside the trench 3 and the contact hole 2a, the plug 7 formed from, for example, tungsten (W) is embedded on an inner side of the barrier metal 6. The surface electrode 8 is disposed from the plug 7 to the second metal film 5 on the interlayer insulating film 2, and on the plug 7 and the second metal film 5. The surface electrode 8, for example, is a metal layer that includes aluminum as a principal constituent, such as an aluminum-copper (Al—Cu) alloy. For example, when the semiconductor device according to the first embodiment is a MOSFET, the surface electrode 8 is a source electrode or source pad.

Although not particularly limited hereto, for example, when the semiconductor device according to the first embodiment has a breakdown voltage rating of 100 V, dimensions of respective portions have the following values. A thickness t1 of the interlayer insulating film 2 is 6000 Å. A depth d from the substrate surface of the trench 3 is 0.5 µm. A width w of the trench 3 is 0.6 µm. A thickness t2 of the first metal film 4 is 800 Å and a thickness t3 of the second metal film 5 is 1000 Å while a thickness t4 of the surface electrode 8 is 5 µm.

Concerning the method of manufacturing a semiconductor device according to the first embodiment, an instance where a MOSFET that has a trench contact is produced will be described as an example. FIG. 2 is a flowchart of an outline of the method of manufacturing a semiconductor device according to the first embodiment. FIGS. 3, 4, 5, and 6 are cross-sectional views of states of the semiconductor device according to the first embodiment during manufacture. First, a predetermined semiconductor device region (not depicted) configuring a surface device structure such as a base region, a source region and the like is formed on the surface side of the semiconductor substrate 1. Next, as depicted in FIG. 3, the interlayer insulating film 2 is formed on the surface of the semiconductor substrate (semiconductor wafer) 1 (step S1). The interlayer insulating film 2 is selectively removed by photolithography and etching, forming the contact hole 2a and exposing the semiconductor device region of the base region, source region, etc. (not depicted) by the contact hole 2a (step S2).

After a resist mask is removed, etching is performed using the interlayer insulating film 2 as a mask and the semiconductor device region exposed in the contact hole 2a is removed, whereby the trench 3 of the predetermined depth d is formed (step S3). At step S3, for example, the semiconductor device region may be etched using, as a mask, the same resist mask used in forming the interlayer insulating film 2. Next, as depicted in FIG. 4, the first metal film 4 formed from titanium and the second metal film 5 formed from titanium nitride are sequentially deposited (formed) as the barrier metal 6 by sputtering, from the surface of the interlayer insulating film 2 to the inner wall of the trench 3, and along the inner wall of the trench 3 and the contact hole 2a (step S4). Here, by forming the first and second metal films 4, 5 using the same sputtering apparatus, processes can be simplified. Further, use of a sputtering apparatus, for example, enables facility costs to be reduced compared to the use of a plasma CVD apparatus.

Heat treatment by rapid thermal treatment (rapid thermal annealing (RTA)) is performed (step S5). This RTA treatment is performed at a temperature high enough to enable conversion of the first metal film 4 to a silicide and reduce the contact resistivity with the semiconductor device region; and this RTA treatment is performed at a temperature low enough that titanium atoms inside the barrier metal 6 do not pull out oxygen (O) atoms from inside the interlayer insulating film 2, i.e., the titanium atoms inside the barrier metal 6 do not react with the oxygen atoms inside the interlayer insulating film 2. More specifically, the temperature of the RTA treatment, for example, is about 500 degrees C. or more and 650 degrees C. or less. By setting the temperature of the RTA treatment to about 500 degrees C. or more, conversion of the first metal film 4 into a silicide progresses and the contact resistivity can be reduced. Further, by setting the temperature of the RTA treatment to be about 650 degrees C. or less, the oxygen atoms inside the interlayer insulating film 2 are not pulled out by the titanium atoms inside the barrier metal 6 and as a result, decreases in the adhesion of the interlayer insulating film and the barrier metal can be prevented. Further, by performing the RTA treatment at a lower temperature than conventionally (e.g., 690 degrees C. to 750 degrees C.), the strength of the surface electrode 8 can be enhanced. As a result, at a mounting process, the peeling of wires joined to the surface electrode 8 can be suppressed. More specifically, conditions of the RTA treatment may be, for example, that the RTA treatment be performed in a nitrogen ($N_2$) atmosphere at a temperature of about 500 degrees C. for about 30 seconds.

Next, titanium atoms (unreacted titanium atoms) that remain unreacted in the first and second metal films 4, 5 are nitrided by a plasma nitriding (ion nitriding) process that uses a gas that includes nitrogen (step S6). In this plasma nitriding process, a gas that includes nitrogen is converted to plasma by glow discharge generated in an electric discharge treatment furnace, unreacted titanium atoms in the first and second metal films 4, 5 are nitrided by radicals formed in the plasma. A condition of the plasma nitriding process is that the temperature of the semiconductor substrate 1 is the temperature of the RTA treatment at step S5 or less. More specifically, conditions of the plasma nitriding process may be that, for example, the temperature of the stage on which the semiconductor substrate 1 is placed in the electric discharge treatment furnace (i.e., the temperature of the semiconductor substrate 1) is about 350 degrees C., the flow-rate of nitrogen gas introduced into the electric discharge treatment furnace is 500 sccm, and the processing time is about 15 sec. The RTA treatment at step S5 and the plasma nitriding process at step S6 may be interchanged.

Figure 6:
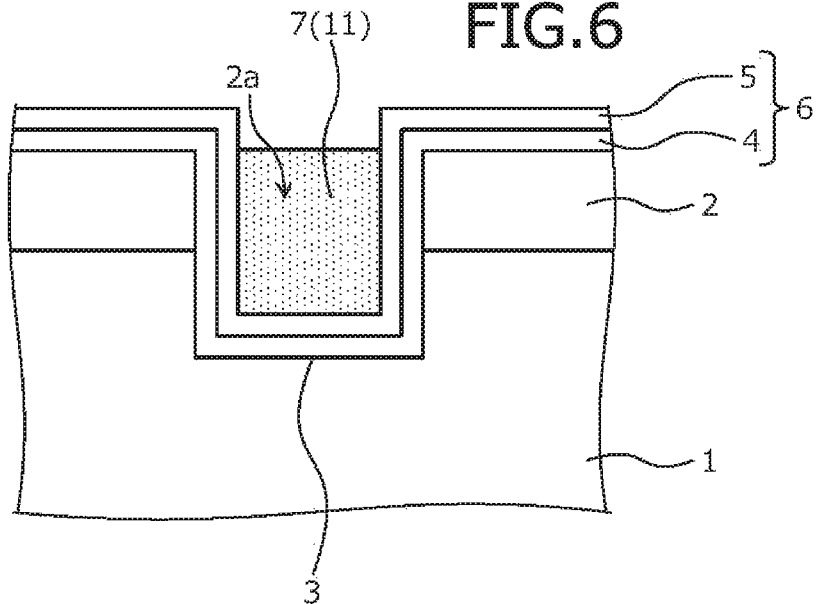

Next, as depicted in FIG. 5, for example, by a CVD method, a tungsten (W) film 11 is formed so as to be embedded at an inner side of the second metal film 5 inside the trench 3 and the contact hole 2a (step S7). At step S7, the tungsten film 11 is further on the interlayer insulating film 2, via the barrier metal 6 (the first metal film 4 and the second metal film 5). Next, as depicted in FIG. 6, the tungsten film 11 is etched until the second metal film 5 on the interlayer insulating film 2 is exposed (step S8). After etching, the tungsten film 11 that remains inside the trench 3 and the contact hole 2a forms the plug 7. Next, as depicted in FIG. 1, the surface electrode 8, which includes, for example, aluminum as a principal constituent, is formed in a surface of the plug 7 and the second metal film 5 by, for example, sputtering (step S9). Thus, by steps S1 to S9, the trench contact depicted in FIG. 1 is completed.

Verification of the temperature of the RTA treatment at step S5 was performed. FIG. 7 is a chart indicating a suitable temperature range in the RTA treatment. Semiconductor devices (samples) were produced according to the described method of manufacturing a semiconductor device according to the first embodiment and at step S5, the temperature of the RTA treatment was varied. Concerning the samples, other than the temperature of the RTA treatment, manufacturing conditions and dimensions of respective portions were those described above. After wire bonding, contact resistivity and whether the barrier metal 6 peeled was confirmed for each sample. The results are shown in FIG. 7. The contact resistivity was measured by a typical property test. In FIG. 7, instances where the contact resistivity was low are indicated as "low" and instances where the contact resistivity was high are indicated as "high". An instance where the contact resistivity was low is a state where the contact resistivity of the first metal film 4 and the semiconductor device region, for example, was at most 0.65 $\Omega \cdot cm^2$, which is a feasible predetermined ON resistivity of a superjunction MOSFET having a breakdown voltage rating of 100 V and an instance where the contact resistivity was high, is a state where the contact resistivity exceeded 0.65 $\Omega \cdot cm^2$. The occurrence of peeling of the barrier metal 6 was confirmed by monitoring cross-sections of the samples using a scanning electron microscope (SEM) and determining whether the barrier metal 6 peeled from the interlayer insulating film 2 at the interface of the interlayer insulating film 2 and the barrier metal 6. In FIG. 7, instances where peeling of the barrier metal 6 occurred are indicated as "yes" and instance where peeling of the barrier metal 6 did not occur are indicated as "no".

As indicated in FIG. 7, it was confirmed that when the temperature of the RTA treatment is 450 degrees C., the first metal film 4 is not converted into a silicide (nitrided silicide does not form) and as a result, the contact resistivity of the first metal film 4 and the semiconductor device region remains high. Although not depicted, it was confirmed by the inventor that when the temperature of the RTA treatment is less than 500 degrees C., at an inner surface of the trench 3, the second metal film 5 peels from the first metal film 4 (hereinafter, peeling of the second metal film 5). On the other hand, it was confirmed that when the temperature of the RTA treatment is 500 degrees C. or higher, the first metal film 4 is converted into a silicide (nitrided silicide is formed) and the contact resistivity of the first metal film 4 and the semiconductor device region could be reduced. However, peeling of the barrier metal 6 was confirmed to occur when the temperature of the RTA treatment is 700 degrees C. Although not depicted, it was confirmed by the inventor that within a temperature range of RTA treatment in a conventional technique (about 690 degrees C. to 750 degrees C.), peeling of the barrier metal 6 occurs and the higher the temperature of the RTA treatment is, the higher the probability is that peeling of the barrier metal 6 occurs. Further, it was confirmed that when peeling of the barrier metal 6 occurs, device properties change and a predetermined device properties cannot be obtained. In contrast, it was confirmed that when the temperature of the RTA treatment is 650 degrees C. or less, peeling of the barrier metal 6 does not occur. Thus, it was confirmed that the temperature of the RTA treatment is preferably about 500 degrees C. or higher and 650 degrees C. or less. Further, although the above suitable temperature range for the RTA treatment of the present invention is a lower temperature than that of a conventional technique, in the present invention, by further performing a plasma nitriding process in addition to the RTA treatment, it was confirmed by the inventor that unreacted titanium atoms in the first and second metal films 4, 5 are nitrided before the formation of the plug 7 and therefore, peeling of the second metal film 5 does not occur.

Second Embodiment

An example of a semiconductor device produced (manufactured) by the method of manufacturing a semiconductor device according to a second embodiment will be described. FIG. 8 is a cross-sectional view of an example of a semiconductor device manufactured according to the method of manufacturing a semiconductor device according to the second embodiment. A semiconductor device produced by the method of manufacturing a semiconductor device according to the second embodiment differs from a semiconductor device produced by the method of manufacturing a semiconductor device according to the first embodiment in that the trench 3 is not formed in the semiconductor substrate 1. In other words, the surface of the semiconductor substrate 1 is exposed by the contact hole 2a.

The barrier metal 6 is disposed from the surface of the interlayer insulating film 2 to an inner wall of the contact hole 2a. The barrier metal 6, similar to the first embodiment, is formed by sequentially stacking the first metal film 4 formed from titanium (Ti) and the second metal film 5 formed from titanium nitride (TiN). Inside the contact hole 2a, the barrier metal 6 is formed on the surface of the semiconductor substrate 1 (a bottom portion of the contact hole 2a), whereby the barrier metal 6 and a predetermined semiconductor device region (not depicted), such as the base region, the source region, the gate electrode, etc. of a MOSFET, disposed on the surface side of the semiconductor substrate 1 and exposed in the contact hole 2a are connected. Inside the contact hole 2a, the plug 7, for example, formed from tungsten (W) is embedded at the inner side of the barrier metal 6. The surface electrode 8 is disposed from the plug 7 to the second metal film 5 on the interlayer insulating film 2, and on the second metal film 5 and the plug 7.

Concerning the method of manufacturing a semiconductor device according to the second embodiment, an instance where a MOSFET is produced will be described as an example. FIG. 9 is a flowchart of an outline of the method of manufacturing a semiconductor device according to the second embodiment. FIGS. 10, 11, 12, and 13 are cross-sectional views of states of the semiconductor device according to the second embodiment during manufacture. The method of manufacturing a semiconductor device according to the second embodiment differs from the method of manufacturing a semiconductor device according to the first embodiment in that the process at step S3 depicted in FIG. 2 (i.e., the process of removing the semiconductor device region exposed in the contact hole 2a to form the trench by performing etching that uses the interlayer insulating film 2 as a mask) is not performed.

More specifically, first, a predetermined semiconductor device region (not depicted) configuring a surface device structure such as a base region, a source region and the like is formed on the surface side of the semiconductor substrate 1. Next, as depicted in FIG. 10, the interlayer insulating film 2 is formed on the surface of the semiconductor substrate (semiconductor wafer) 1 (step S11). The interlayer insulating film 2 is selectively removed by photolithography and etching, forming the contact hole 2a and exposing the semiconductor device region of the base region, source region, etc. (not depicted) by the contact hole 2a (step S12). Next, as depicted in FIG. 11, the first metal film 4 formed from titanium and the second metal film 5 formed from titanium nitride are sequentially deposited (formed) as the barrier metal 6 by sputtering, from the surface of the interlayer insulating film 2 to the inner wall of the contact hole 2a (step S13). Similar to the first embodiment, by rapid thermal treatment (step S14) and a plasma nitriding (ion nitriding) process that uses a gas that includes nitrogen, unreacted titanium atoms in the first and second metal films 4, 5 are nitrided (step S15).

Figure 12:
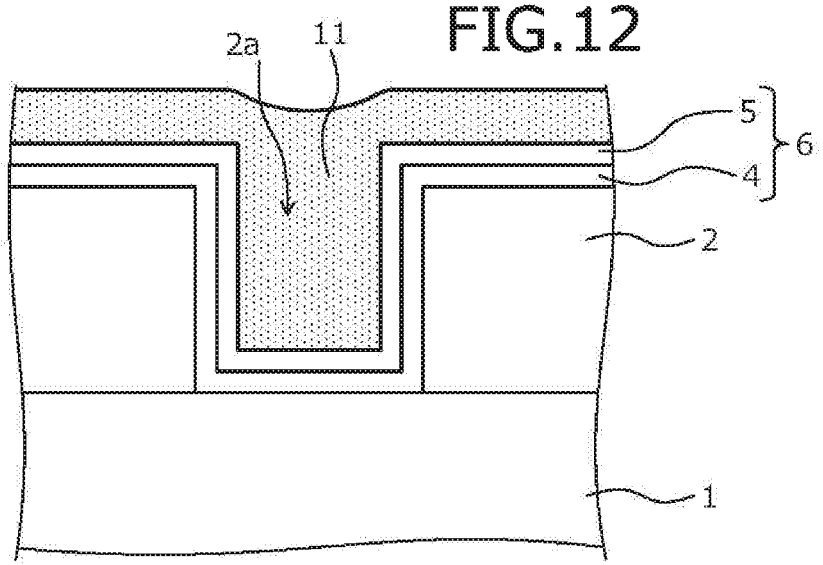
Figure 13:
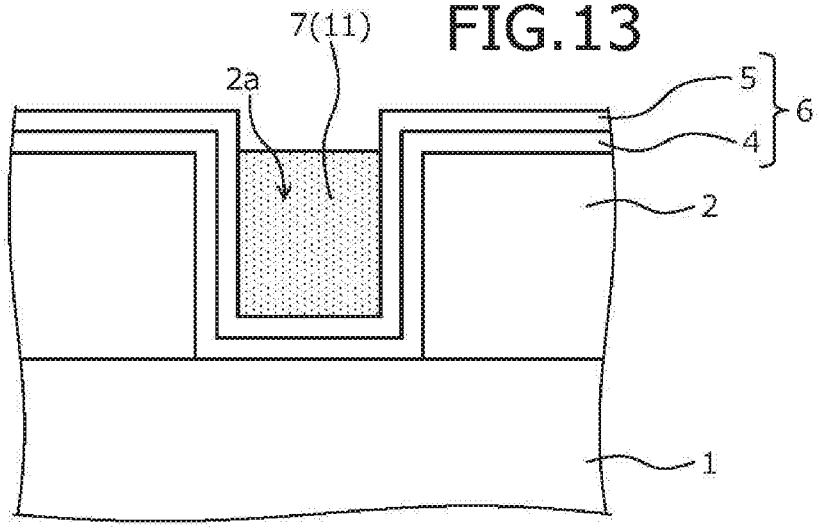

Next, as depicted in FIG. 12, for example, by a CVD method, the tungsten film 11 is formed so as to be embedded at the inner side of the second metal film 5 inside the contact hole 2a (step S16). Next, as depicted in FIG. 13, the tungsten film 11 is etched until the second metal film 5 on the interlayer insulating film 2 is exposed (step S17). After etching, the tungsten film 11 that remains inside the contact hole 2a forms the plug 7. Next, the surface electrode 8, which includes, for example, aluminum as a principal constituent, is formed in a surface of the plug 7 and the second metal film 5 by, for example, sputtering (step S18). Thus, by steps S11 to S18, the trench contact depicted in FIG. 8 is completed. In other words, steps S13 to S18 of the second embodiment are steps S4 to S9 (refer to FIG. 2) of the first embodiment, performed without forming the trench in the contact hole 2a. According to this embodiment, the barrier metal 6 is formed without etching the semiconductor device region (not shown) of the semiconductor substrate 1 exposed by the contact hole 2a formed in the interlayer insulating film 2, and no portion of the semiconductor substrate 1 is etched to form a trench. In the second embodiment, effects identical to those of the first embodiment can be achieved.

As described, according to the embodiments, after forming the first and second metal films that are the barrier metal, by further performing a plasma nitriding process in addition to rapid thermal treatment, the rapid thermal treatment can be performed a low enough temperature such that titanium atoms inside the barrier metal do not react with the oxygen atoms in the interlayer insulating film and pull the oxygen atoms from the interlayer insulating film. As a result, decreases in the adhesion of the interlayer insulating film and the barrier metal can be avoided, whereby at a subsequent mounting process, the barrier metal does not peel from the interlayer insulating film during wire bonding of joining wires to the surface electrode. Therefore, tolerance of loads such as ultrasonic vibration, forces applied during wire bonding, etc. can be enhanced. Further, even if the rapid thermal treatment is performed at a low temperature such that titanium atoms inside the barrier metal do not pull out oxygen atoms from inside the interlayer insulating film, unreacted titanium atoms inside the first and second metal films can be nitrided by radicals generated by the plasma nitriding process. As a result, the function of the barrier metal can be enhanced, enabling fluorine atoms that are included in the source gas during plug formation thereafter to be prevented from penetrating the second metal film and reaching the first metal film. As a result, the occurrence of a gap between the first and the second metal films can be avoided, whereby the second metal film does not peel from the first metal film at the interface of the first and second metal films. Since peeling of the barrier metal and peeling of the second metal film can be prevented in this manner, variations of device properties after assembly can be avoided and predetermined device properties based on design specifications can be obtained, whereby reliability can be improved. Further, since the rapid thermal treatment is performed at a temperature high enough that silicidation of the first metal film progresses, contact resistivity of the first metal film and the semiconductor device region can be reduced.

The present invention is not limited to the embodiments described and can be modified variously within a range not departing from the spirit of the present invention. For example, although a superjunction MOSFET is described as an example in the embodiments above, the device structures can be changed variously according to design specifications. The present invention is not limited to a trench contact and in the embodiments above, can achieve the same effects when the barrier metal is disposed along the surface of the semiconductor substrate exposed in the contact hole, without disposing the trench. Further, in the embodiments above, the breakdown voltage, dimensions of respective portions, etc. are set according to required specifications.

According to the present invention, by performing the plasma nitriding process, heat treatment can be performed at a temperature low enough that titanium atoms inside the barrier metal (first and second metal films) insulating film do not pull out oxygen atoms. As a result, decreases in the adhesion of the insulating film and the barrier metal can be avoided, whereby at a subsequent mounting process, the barrier metal does not peel from the insulating film during wire bonding of joining wires to the surface electrode. Further, after formation of the first and second metal films, titanium atoms that remain unreacted inside the first and second metal films can be nitrided by radicals generated by the plasma nitriding process. As a result, the function of the barrier metal can be enhanced, whereby fluorine atoms that are included in the source gas during plug formation thereafter can be prevented from penetrating the second metal film and reaching the first metal film. As a result, the occurrence of a gap between the first and second metal films can be avoided, whereby peeling of the second metal film from the first metal film at the interface of the first and second metal films does not occur. Therefore, variation of device properties after assembly can be avoided. Moreover, since heat treatment is performed at a temperature high enough that silicidation of the first metal film progresses, contact resistivity of the first metal film and a semiconductor device region such as the source region, the gate electrode, etc. formed on the surface side of the semiconductor substrate can be reduced.

The method of manufacturing a semiconductor device according to the invention achieves an effect in that contact resistivity can be reduced and reliability can be improved.

As described, the method of manufacturing a semiconductor device according to the present invention is useful for semiconductor devices that have a trench contact and is particularly suitable for low breakdown voltage semiconductor devices reduced in size.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a semiconductor device, the method comprising:
   forming an insulating film on a first surface of a semiconductor substrate;
   forming a contact hole that penetrates the insulating film in a direction of depth and reaches the semiconductor substrate;
   forming a first metal film from titanium, from a surface of the insulating film to a surface of a semiconductor device region of the semiconductor substrate exposed in the contact hole;
   forming a second metal film from titanium nitride on a surface of the first metal film;
   converting the first metal film into a silicide by heat treatment;
   converting titanium atoms that remain unreacted inside the first metal film and the second metal film into a nitride by a plasma nitriding process;
   embedding a plug formed from tungsten at an inner side of the second metal film inside the contact hole after the heat treatment and the plasma nitriding process; and
   forming a surface electrode that includes aluminum as a principal constituent, from a surface of the second metal film on the insulating film to a surface of the plug,
   wherein converting the first metal film into the silicide by heat treatment is performed at a temperature at which the titanium atoms inside the first metal film and the second metal film do not react with oxygen atoms inside the insulating film.

2. The method according to claim 1, wherein the plasma nitriding process is performed at a temperature that is lower than that of the heat treatment.

3. The method according to claim 1, wherein the heat treatment is performed at a temperature range of 500 degrees C. to 650 degrees C.

4. The method according to claim 1, wherein rapid thermal treatment is performed as the heat treatment.

5. The method according to claim 1, wherein the first metal film and the second metal film are formed consecutively.

6. The method according to claim 1, wherein the first metal film is formed by sputtering.

7. The method according to claim 1, wherein the second metal film is formed by sputtering.

8. The method according to claim 1 and further comprising
   forming a trench in the semiconductor device region, after forming the contact hole and before forming the first metal film, wherein
   the first metal film is formed from the surface of the insulating film to an inner wall of the trench, and
   the plug is embedded at an inner side of the second metal film inside the trench and the contact hole.

9. The method according to claim 1, wherein the semiconductor substrate is a silicon substrate.

10. A method of manufacturing a semiconductor device, the method comprising:
    forming an insulating film on a first surface of a semiconductor substrate;
    forming a contact hole in the insulating film, the contact hole extending to the semiconductor substrate;
    forming a first metal film on a first surface of the insulating film, and walls of the insulating film defining the contact hole, and on an exposed surface of the semiconductor substrate defining the contact hole;
    forming a second metal film on a surface of the first metal film, the second metal film being an alloy having at least one metal element in common with the first metal film;
    converting the first metal film into a silicide by heat treatment;
    converting unreacted atoms inside the first metal film and the second metal film into a nitride by a plasma nitriding process;
    embedding a plug on an inner side of the second metal film defining the contact hole; and
    forming a surface electrode over a surface of the second metal film and a surface of the plug,
    wherein converting the first metal film into a silicide is performed at a temperature at which metal atoms inside the first metal film and the second metal film do not react with oxygen atoms inside the insulating film.

11. The method of claim 10, wherein forming the contact hole includes etching both the insulating film and the semiconductor substrate to form a trench that extends into the semiconductor substrate.

12. The method of claim 10, wherein forming the contact hole includes etching the insulating film to form a trench only in the insulating film without etching the semiconductor substrate.

13. The method of claim 10, wherein the first metal film is titanium, and the second metal film is titanium nitride.

14. The method of claim 10, wherein converting unreacted atoms inside the first metal film and the second metal film into a nitride by a plasma nitriding process is performed at a temperature that is lower than that of the heat treatment.

15. The method of claim 10, wherein converting unreacted atoms inside the first metal film and the second metal film into a nitride by a plasma nitriding process is performed at a temperature range of 500 degrees C. to 650 degrees C.

* * * * *